United States Patent [19]
Gardner et al.

[11] Patent Number: 6,104,077
[45] Date of Patent: Aug. 15, 2000

[54] SEMICONDUCTOR DEVICE HAVING GATE ELECTRODE WITH A SIDEWALL AIR GAP

[75] Inventors: Mark I. Gardner, Cedar Creek; Derick Wristers, Austin; Jon Cheek, Round Rock, all of Tex.

[73] Assignee: Advanced Micro Devices, Inc., Sunnyvale, Calif.

[21] Appl. No.: 09/060,160

[22] Filed: Apr. 14, 1998

[51] Int. Cl.[7] .......................... H01L 29/00; H01L 29/76; H01L 29/94; H01L 31/062
[52] U.S. Cl. .......................... 257/522; 257/377; 257/382; 257/344; 257/336; 257/404; 257/410
[58] Field of Search .................................... 257/344, 336, 257/404, 900, 410, 522, 377, 382

[56] References Cited

U.S. PATENT DOCUMENTS

| | | | |
|---|---|---|---|
| 3,886,584 | 5/1975 | Cook, Jr. et al. | 257/410 |
| 4,169,000 | 9/1979 | Riseman | 257/522 |
| 5,668,398 | 9/1997 | Havemann et al. | 257/522 |
| 5,742,363 | 4/1998 | Bae | 257/344 |

FOREIGN PATENT DOCUMENTS 404221856A  8/1992  Japan ..................... 257/900

*Primary Examiner*—Mahshid Saadat
*Assistant Examiner*—Jesse A. Fenty

[57] ABSTRACT

A semiconductor device having a gate electrode with a sidewall air gap is provided. In accordance with this embodiment, at least one gate electrode is formed over a substrate. A spacer is then formed adjacent an upper sidewall portion of the gate electrode such that an open area is left beneath the spacer. Next, a dielectric layer is formed over the spacer and the gate electrode, thereby leaving an air gap in the open area. In accordance with one aspect of the invention, both the gate electrode and the spacer adjacent the gate electrode are formed from polysilicon. This, for example, allows the formation of a wider contact area to the gate electrode.

31 Claims, 3 Drawing Sheets

SEMICONDUCTOR DEVICE HAVING GATE ELECTRODE WITH A SIDEWALL AIR GAP

FIELD OF THE INVENTION

The present invention is generally related to semiconductor devices and, more particularly, to a semiconductor device having a gate electrode with a sidewall air gap and a process of fabricating such a semiconductor device.

BACKGROUND OF THE INVENTION

Over the last few decades, the electronics industry has undergone a revolution by the use of semiconductor technology to fabricate small, highly integrated electronic devices. The most common semiconductor technology presently used is silicon-based. A large variety of semiconductor devices have been manufactured having various applications in numerous disciplines. One such silicon-based semiconductor device is a metal-oxide-semiconductor (MOS) transistor. The MOS transistor is used as one of the basic building blocks of most modem electronic circuits.

The principal elements of a typical MOS semiconductor device are illustrated in FIG. 1. The device generally includes a semiconductor substrate 101 on which a gate electrode 103 is disposed. The gate electrode 103 acts as a conductor. An input signal is typically applied to the gate electrode 103 via a gate terminal (not shown). Heavily doped source/drain regions 105 are formed within the semiconductor substrate 101 and are connected to source/drain terminals (not shown). As illustrated in FIG. 1, the typical MOS transistor is symmetrical, which means that the source and drain are interchangeable. Whether a region acts as a source or drain depends on the respective applied voltages and the type of device being made (e.g., PMOS, NMOS, etc.).

A channel region 107 is formed in the semiconductor substrate 101 beneath the gate electrode 103 and separates the source/drain regions 105. The channel is typically lightly doped with a dopant of a type opposite to that of the source/drain regions 105. The gate electrode 103 is generally separated from the semiconductor substrate 101 by an insulating layer 109, typically an oxide layer such as $SiO_2$. The insulating layer 109 is provided to prevent current from flowing between the gate electrode 103 and the source/drain regions 105 or channel region 107.

In operation, an output voltage is typically developed between the source and drain terminals. When an input voltage is applied to the gate electrode 103, a transverse electric field is set up in the channel region 107. By varying the transverse electric field, it is possible to modulate the conductance of the channel region 107 between the source region and the drain region. In this manner, an electric field controls the current flow through the channel region 107. This type of device is commonly referred to as a MOS field-effect-transistor (MOSFET).

Semiconductor devices, like the one described above, are used in large numbers to construct most modem electronic devices. In order to increase the capability of such electronic devices, it is necessary to integrate even larger numbers of such devices into a single silicon wafer. As the semiconductor devices are scaled down (i.e., made smaller) in order to form a larger number of devices on a given surface area, the structure of the devices and fabrication techniques used to make such devices must be altered.

SUMMARY OF THE INVENTION

The invention generally provides a semiconductor device having a gate electrode with a sidewall air gap and a process of fabricating such a device. In accordance with one exemplary embodiment of the invention, a process of fabricating a semiconductor device is provided. In accordance with this process, at least one gate electrode is formed over a substrate. A spacer is then formed adjacent an upper sidewall portion of the gate electrode such that an open area is left beneath the spacer. Next, a dielectric layer is formed over the spacer and the gate electrode, thereby leaving an air gap in the open area. In accordance with one aspect of the invention, both the gate electrode and the spacer adjacent the gate electrode are formed from polysilicon. This, or example, allows the formation of a wide contact landing for the gate electrode.

A semiconductor device, in accordance with an embodiment of the invention, includes a substrate and at least one gate electrode disposed over the substrate. A spacer is disposed on an upper sidewall portion of the gate electrode and a dielectric layer is disposed over the substrate. The spacer along with the dielectric layer and a lower sidewall portion of the gate electrode define an air gap beneath the spacer. As above, both the spacer and the gate electrode may, for example, be formed from polysilicon to provide a wide contact landing.

The above summary of the present invention is not intended to describe each illustrated embodiment or every implementation of the present invention. The figures and the detailed description which follow more particularly exemplify these embodiments.

BRIEF DESCRIPTION OF THE DRAWINGS

The invention may be more completely understood in consideration of the following detailed description of various embodiments of the invention connection with the accompanying drawings, in which.

Figure 1:
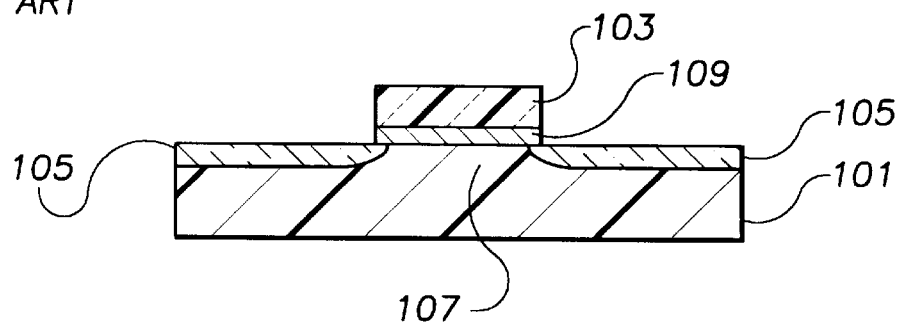
FIG. 1 illustrates a conventional transistor.

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the spirit and scope of the invention as defined by the appended claims.

DETAILED DESCRIPTION OF THE DRAWINGS

The present invention generally provides a semiconductor device having a gate electrode with a sidewall air gap and a method for fabricating such a device. The present invention is applicable to a number of semiconductor devices including, for example, MOS, CMOS, and BiCMOS transistors. While the present invention is not limited to such devices, an appreciation of various aspects of the invention will be gained through a discussion of various fabrication processes and device characteristics in connection with the examples provided below.

Figure 2A:
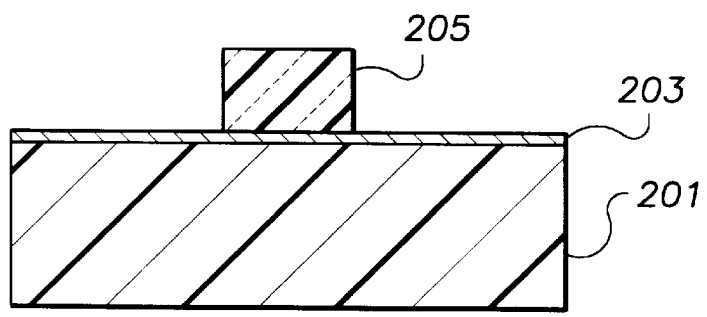
FIGS. 2A–2F illustrate an exemplary fabrication process in accordance with one embodiment of the invention.

FIGS. 2A–2F illustrate an exemplary fabrication process in accordance with one embodiment of the invention in which a sidewall air gap is formed adjacent a gate electrode. In accordance with this exemplary process, a gate insulating layer 203 is formed over a substrate, typically a silicon substrate, 201. The gate insulating layer 203 may be formed from a number of different dielectric materials using, for example, well-known techniques such as growth or deposition. Suitable dielectric materials for the gate insulating layer 203 include, for example, oxides such as oxynitrides, nitrides such as silicon nitride, or materials with higher dielectric constants such as titanium dioxide ($TiO_2$) or barium strontium titanate (BST). One or more gate electrodes (only one of which is shown) are formed over the gate insulating layer 203. The gate electrode 205 may, for example, be formed from polysilicon using a number of different well-known techniques. The resultant structure is illustrated in FIG. 2A. The thickness or height of the gate electrode 205 can vary and may, for example, range from about 1000 to 2000 angstroms (Å).

Figure 2B:
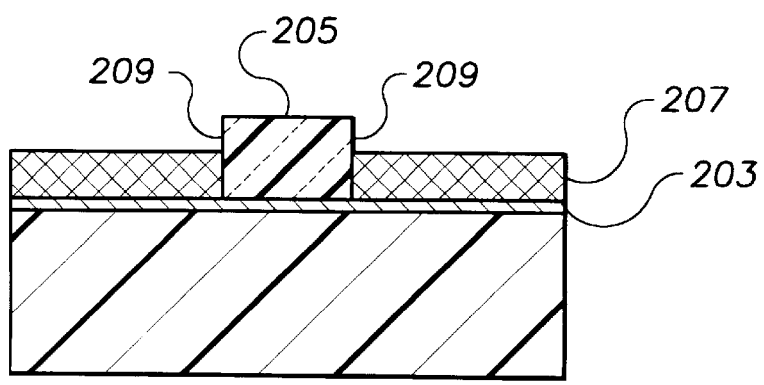

A sacrificial layer 207, having a thickness less than the thickness of the gate electrode 205, is then formed adjacent the gate electrode 205, as illustrated in FIG. 2B. The sacrificial layer 207 may be formed from a number of different dielectric materials using, for example, well-known deposition techniques. To achieve a relatively planar sacrificial layer 207, the sacrificial layer 207 may be formed by depositing a relatively thick layer of dielectric material (for example, thicker than the gate electrode 205) over the gate insulating layer 203 and gate electrode 205, polishing the dielectric layer, and subsequently etching the layer of dielectric material to form the sacrificial layer 207 as shown in FIG. 2B. Etching of the dielectric material may, for example, be performed by directional or anisotropic plasma etching techniques so that the height of the deposited dielectric material may be reduced uniformly. However, other etching techniques, such as wet etching techniques, may be used. Polishing of the dielectric layer may, for example, be performed using chemical-mechanical polishing techniques.

The sacrificial layer 207 will be used to form spacers 211 (see FIG. 2C) adjacent exposed upper sidewall portions 209 of the gate electrode 205 and to form air gaps 229 (see FIG. 2E) adjacent the gate electrode 205 and beneath the spacers 211. The amount by which the sacrificial layer 207 is recessed relative to the upper surface of the gate electrode 205 (i.e., the height of the exposed sidewall portions 209) is typically selected in consideration of the desired height of the spacers 211 as well as the desired height of the air gaps 229 formed therebelow. For many applications, the sacrificial layer 207 is recessed relative to the upper surface of the gate electrode 205 by about ¼ to ⅓ the height of the gate electrode 205 (or, in the exemplary embodiment, by about 250 to 650 Å).

After forming the spacers 211, the sacrificial layer 207 will be removed from over the gate insulating layer 203 as will be discussed further below. In order to maintain the reliability of the gate insulating layer 203 beneath the gate electrode 205, the sacrificial layer 207 is typically formed from a dielectric material which is selectably etchable with respect to the gate insulating layer 203. For example, the sacrificial layer 207 may be formed from an oxide, such as silicon dioxide, when the gate insulating layer 203 is formed from a nitride, an oxynitride, or a high permittivity material such as titanium dioxide or BST.

Figure 2C:
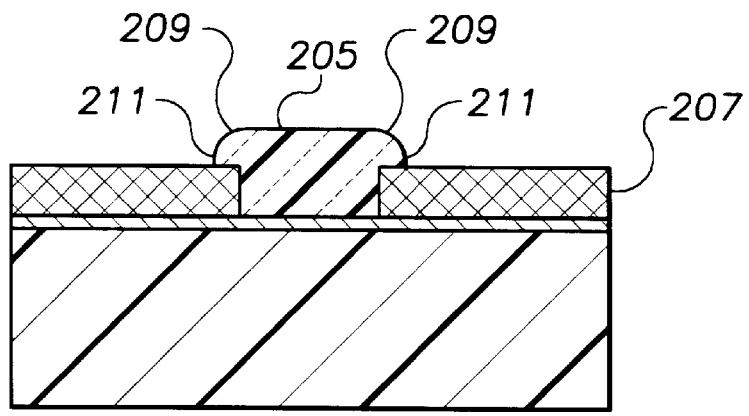

The spacers 211 are then formed adjacent the upper exposed sidewall portions 209 of the gate electrode 205, as illustrated in FIG. 2C. The spacers 211 may, for example, be formed by depositing a suitable material and etching the material using, for example, well-known spacer deposition and etching techniques. The spacers 211 are typically formed from a material which allows selective etching of the sacrificial layer 207 while leaving the spacers 211 intact. Advantageously, the spacers 211 may be formed from a silicon, such as polysilicon. Polysilicon spacers 211 can, for example, provide a larger surface area for contacting the gate electrode 205 and reduce the contact resistance to the gate electrode 205. An air gap 229 will be formed beneath each of the spacers 211 as will be discussed below. In addition, as in the exemplary embodiment, the spacers 211 may be used in combination with a source/drain implant to define the profile of source/drain regions adjacent the gate electrode 205. The width of the spacers 211 is typically selected in consideration of the desired width of these air gaps 229 and, in certain embodiments the desired source/drain profile. Suitable widths for the spacers 211 range from about 100 to 800 Å for many applications.

The height of the spacers 211 typically depends on the height of the exposed sidewall portions 209 of the gate electrode 205 and is typically selected in consideration of the desired height of the air gap and, in some cases, in consideration of a subsequent source/drain implant and the desired dopant blocking by the spacers 211 during the subsequent source/drain implant. For example, in some cases it may be desirable to have a small amount of the dopant pass through the spacers 211 to form lightly doped regions in the substrate 201 adjacent the gate electrode 205. On the other hand, in other embodiments, it may be desirable that the spacers 211 substantially prevent all dopant implantation into substrate regions beneath the spacers 211. For many applications, suitable heights of the spacers 211 range from about ¼ to ⅓ the height of the gate electrode 205 as discussed above.

Figure 2D:
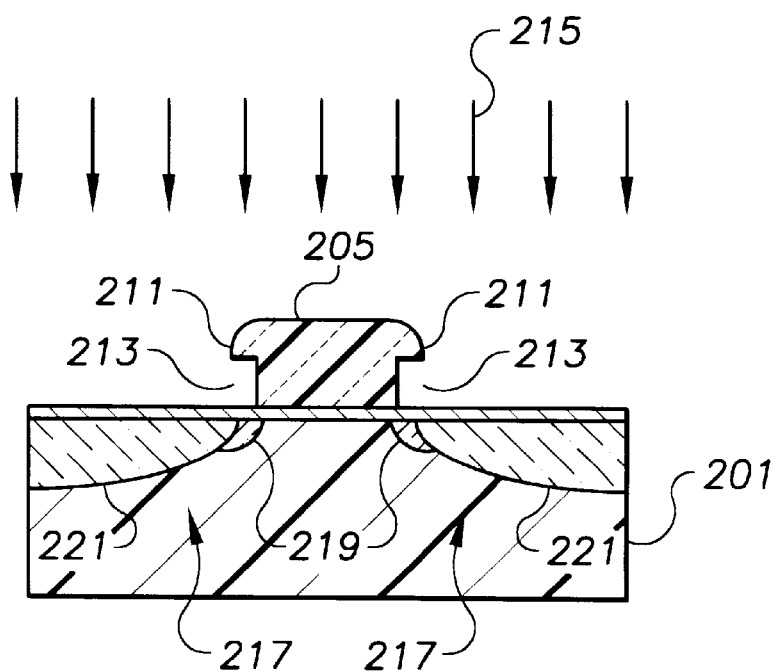

Following the formation of the spacers 211, the sacrificial layer 207 is removed from under the spacers 211 to form open areas 213 therebelow. The sacrificial layer 207 may be removed using, for example, well-known etching techniques, such as isotropic wet-etching techniques. Typically, the sacrificial layer 207 is removed in whole at this time. In the exemplary embodiment, dopant 215 is then implanted into the substrate 201 to form active regions 217 adjacent the gate electrode 205. The resultant structure is illustrated in FIG. 2D. The active regions 217 may, for example, be used as source/drain regions for a transistor device. The implant energies and dopant dosages may be suitably selected in consideration of the desired profile of the active regions 217. In particular, the energy level may be selected in consideration of the thickness of the spacers 211 to determine whether dopant 215 passes through the spacers 211 and into the substrate 201. The energy level of the dopant 215 implant may, for example, be selected to implant the dopant 215 through the spacers 211, thereby forming lightly-doped regions 219 adjacent the gate electrode 205 and more heavily doped regions 221 further away from the gate electrode 205, as in the example embodiment. In this manner, LDD (lightly-doped drain) source/drain regions may be formed. Suitable energy levels and dopant dosages range from about 50 to 100 KEV and 2E15 ($2\times10^{15}$) to 8E15 ($8\times10^{15}$) dopant atoms/$cm^2$, respectively, for many applications.

Portions of the gate insulating layer 203 over the active regions 217 may then be removed to expose portions of the substrate 201. The remaining gate insulating layer 203a typically extends between edges of the gate electrode 205 and may extend to about the outer edges of the spacers 211, as in the illustrated embodiment. The portions of the gate insulating layer 203 over the active regions 217 may be removed using, for example, a variety of well-known wet or dry etching techniques. One suitable etching technique, for example, uses a 10:1 HF dip.

Following the gate insulating layer removal, silicide layers 223a–c may be formed over exposed portions of the active regions 217 and the gate electrode 205 (as well as the spacers 211 when formed of silicon). The silicide layers 223a–c may, for example, be formed by depositing a layer of metal (e.g., cobalt, tungsten or titanium) over the substrate 201 and reacting the deposited metal with exposed silicon or polysilicon to form the silicide layers 223a–c. Typically, this is followed by removal of any unreacted portions of the deposited metal. The metal may be deposited using a number of different deposition techniques, including, for example, sputter or chemical vapor deposition techniques. Advantageously, the spacers 211 and the open areas 213 serve to space the deposited metal over the active regions 217 from the deposited metal over the gate electrode 205 and spacers 211, thereby preventing any shorting between the active regions 217 and the gate electrode 205.

Figure 2E:
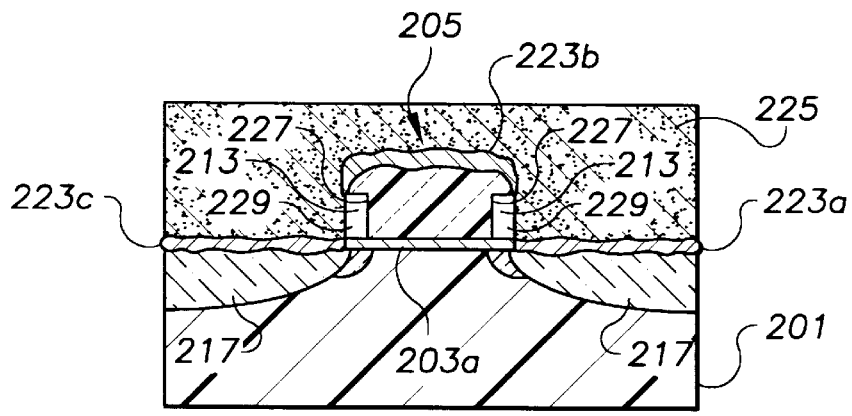

A dielectric layer 225 is then formed over the substrate 201. The resultant structure is illustrated in FIG. 2E. The dielectric layer 225 may, for example, be an oxide such as silicon dioxide, which is deposited over the substrate 201 using well-known deposition techniques. During the deposition process, the spacers 211 space the deposited oxide from the lower portions 227 of the gate electrode 205 such that an air gap 229 is formed beneath each spacer 211 and between lower sidewall portions 227 of the gate electrode 205 and the dielectric layer 225. Typically, the dielectric layer 225 is formed with a thickness greater than the gate electrode 205. Suitable thicknesses of the dielectric layer 225 range from about 3000 to 5000 Å for many applications.

Figure 2F:
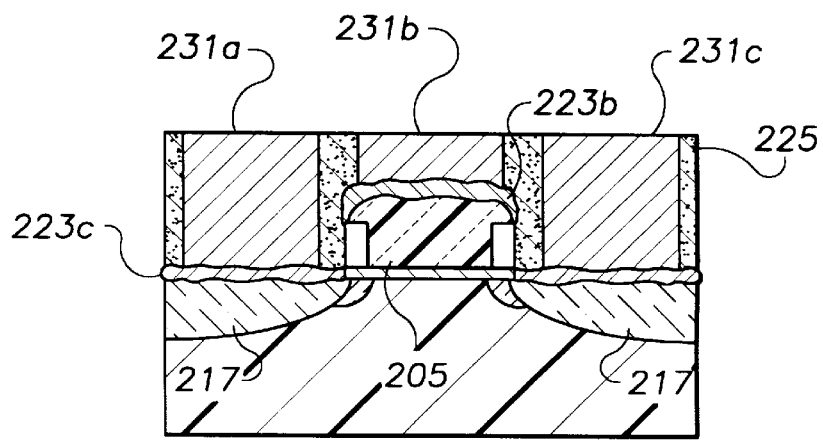

Contacts 231a–c to the active regions 217 and the gate electrode 205 may be formed in the dielectric layer 225 as shown in FIG. 2F. The contacts 231a–c may, for example, be formed by masking and etching the dielectric layer 225 to form openings therein exposing the silicide layers 223a–c on the active regions 217 and the gate electrode 205. The openings may then be filled with a conductive material (e.g., a metal) using, for example, well-known deposition techniques. The widths of the contacts 231a–c are typically optimized to reduce the resistance to the active devices, while maintaining device reliability. The width of the gate electrode contact 231b may, in particular, be wider than the gate electrode 205 and extend over a silicide layer 223b which covers both the gate electrode 205 and the spacers 211. The extended width of the gate contact 231b serves to further reduce the resistance between the contact 231b and the gate electrode 205 and further enhance device performance.

Using the above process, a semiconductor device having a gate electrode with a sidewall air gap may be formed. The air gap can, for example, improve the insulation of the gate electrode from nearby active devices and further increase device performance as compared to conventionally formed gate electrodes. The above process further provides an efficient technique for forming LDD source/drain regions in a single step. This can, for example, simplify the fabrication process as compared to conventional techniques which use multiple implants to form LDD source/drain regions. Formation of spacers using silicon can further enhance device performance as compared to conventional techniques. For example, polysilicon spacers can provide a larger contact area for a gate electrode contact and reduce the resistance between the contact and the gate electrode as compared to conventional contacts.

It is stressed that the above process is provided by way of example and not of limitation. Many variations in the formation of a gate electrode with a sidewall air gap fall within the scope of the invention. For example, doping of active regions adjacent the gate electrode may be performed before, rather than after, formation of the spacers if desired. For instance, the active regions may be doped after forming the gate electrode in FIG. 2A. In another case, an LDD implant may be performed prior to spacer formation and a source/drain implant performed afterwards. In this case, the spacers may substantially inhibit dopant implant therethrough.

As noted above, the present invention provides a semiconductor device and a method of fabricating a semiconductor device having a gate electrode with a sidewall air gap. The present invention should not be considered limited to the particular examples described above, but rather should be understood to cover all aspects of the invention as fairly set out in the attached claims. Various modifications, equivalent processes, as well as numerous structures to which the present invention may be applicable will be readily apparent to those of skill in the art to which the present invention is directed upon review of the present specification. The claims are intended to cover such modifications and devices.

What is claimed is:

1. A semiconductor device, comprising:

a substrate;

at least one gate electrode disposed over the substrate;

a silicon spacer disposed on an upper sidewall portion of the gate electrode; and a dielectric layer disposed over the substrate; and a continuous silicide layer extending from a distal end of the silicon spacer apart from the gate electrode, to a distal end of the gate electrode, apart from the spacer;

wherein the spacer, the dielectric layer and a lower sidewall portion of the gate electrode define an air gap beneath the spacer.

2. The semiconductor device of claim 1, wherein the air gap has a height of about ⅔ to ¾ a height of the gate electrode.

3. The semiconductor device of claim 1, wherein the air gap has a width ranging from about 100 to 800 angstroms.

4. The semiconductor device of claim 1, wherein the spacers is formed of polysilicon.

5. The semiconductor device of claim 4, wherein the spacers has a width ranging from about 100 to 800 angstroms.

6. The semiconductor device of claim 4, wherein the spacers has a height ranging from about 250 to 650 angstroms.

7. The semiconductor device of claim 4, wherein the polysilicon spacer and the gate electrode form a contact landing wider than the gate electrode and the semiconductor device further includes a conductive contact wider than the gate electrode, the conductive contact disposed in the dielectric layer and contacting the contact landing.

8. The semiconductor device of claim 7, further including a continuous silicide layer extending from a distal end of the spacer, apart from the gate electrode, to a distal end of the gate electrode, apart from the spacer, wherein the contact contacts the silicide layer.

9. The semiconductor device of claim 1, further including a gate insulating layer disposed between the gate electrode and the substrate, the gate insulating layer extending from under the gate electrode to beneath at least part of the air gap.

10. The semiconductor device of claim 9, the gate insulating layer extends to the dielectric layer.

11. The semiconductor device of claim 1, wherein the silicon spacer contacts the gate electrode.

12. The semiconductor device of claim 1, wherein the dielectric layer covers at least part of an active region extending from the same side of the gate electrode as the spacer, the dielectric layer having a wall substantially aligned with an outer edge of the spacer, the air gap being disposed between the wall of the dielectric layer and the lower sidewall portion of the gate electrode.

13. A semiconductor device, comprising:
a substrate;
at least one gate electrode disposed over the substrate;
spacers disposed on upper sidewall portions on the gate electrode;
a dielectric layer disposed over the substrate;
a gap defined beneath each spacer and between the dielectric layer and the gate electrode; and
a gate insulating layer extending from under the gate electrode to beneath at least part of each gap.

14. The semiconductor device of claim 13, wherein each gap has a height of about ⅔ to ¾ the height of a gate electrode.

15. The semiconductor device of claim 13, wherein each gap has a width ranging from about 100 to 800 Angstroms.

16. The semiconductor device of claim 13, wherein each spacer is formed from polysilicon.

17. The semiconductor device of claim 16, wherein each spacer has a width ranging from about 100 to 800 Angstroms.

18. The semiconductor device of claim 16, wherein each spacer has a height ranging from about 250 to 650 Angstroms.

19. The semiconductor device of claim 16, wherein the spacers formed from polysilicon and the gate electrode form a contact landing wider than the gate electrode and the semiconductor device further includes a conductive contact wider than the gate electrode, the conductive contact disposed on the dielectric layer and contacting the contact landing.

20. The semiconductor device of claim 19, further including a continuous silicide extending between distal ends of the spacers and over the gate electrode, wherein the contact contacts the silicide layer.

21. The semiconductor device of claim 13, wherein:
the spacers are formed from a silicon and each spacer includes a distal end apart from the gate electrode; and
the device further includes a continuous silicide layer extending between the distal ends of the spacers and over the gate electrode.

22. The semiconductor device of claim 21, wherein each silicon spacer contacts the gate electrode.

23. The semiconductor device of claim 13, further including an active region defined in the substrate adjacent each side of the gate electrode, wherein the dielectric layer covers at least part of each active region and defines two walls, each substantially aligned with an outer edge of a corresponding one of the spacers, each gap being disposed between one of the dielectric walls and the gate electrode.

24. The semiconductor device of claim 13, wherein each gap is an air gap.

25. The semiconductor device of claim 24, wherein each air gap contacts a sidewall of the gate electrode.

26. The semiconductor device of claim 13, the gate insulating layer extends to the dielectric layer on each side of the gate electrode.

27. A semiconductor device, comprising:
a substrate;
at least one gate electrode disposed over the substrate;
a spacer disposed on an upper sidewall portion of the gate electrode; and
a dielectric layer disposed over the substrate and arranged to cover at least part of an active region extending from the same side of the gate electrode as the spacer, and having a wall substantially aligned with an outer edge of the spacer;
wherein the spacer, the dielectric layer and a lower sidewall portion of the gate electrode define an air gap beneath the spacer, the air gap being disposed between the wall of the dielectric layer and the lower sidewall portion of the gate electrode.

28. A semiconductor device, comprising:
a substrate;
at least one gate electrode disposed over the substrate;
a spacer formed of polysilicon and disposed on an upper sidewall portion of the gate electrode;
a dielectric layer disposed over the substrate;
a conductive contact wider than the gate electrode, the conductive contact disposed in the dielectric layer and contacting the contact landing; and
a continuous silicide layer extending from a distal end of the spacer, apart from the gate electrode, to a distal end of the gate electrode, apart from the spacer;
wherein the spacer, the dielectric layer and a lower sidewall portion of the gate electrode define an air gap beneath the spacer, wherein the polysilicon spacers and the gate electrode form a contact landing wider than the gate electrode, and wherein the contact contacts the silicide layer.

29. A semiconductor device, comprising:
a substrate;
at least one gate electrode disposed over the substrate;
silicon spacers having a distal end apart from the gate electrode and disposed on upper sidewall portions on the gate electrode; and
a continuous silicide layer extending between the distal ends of the spacers and over the gate electrode.

30. A semiconductor device, comprising:
a substrate;
at least one gate electrode disposed over the substrate;
spacers disposed on upper sidewall portions on the gate electrode;
a dielectric layer disposed over the substrate;
a gap defined beneath each spacer and between the dielectric layer and the gate electrode; and
an active region defined in the substrate adjacent each side of the gate electrode;
wherein the dielectric layer covers at least part of each active region and defines two walls, each substantially aligned with an outer edge of a corresponding one of the spacers, each air gap being disposed between one of the dielectric walls and the gate electrode.

31. A semiconductor device, comprising:
a substrate;
at least one gate electrode disposed over the substrate;
polysilicion spacers disposed on upper sidewall portions on the gate electrode, wherein the spacers and the gate electrode form a contact landing wider than the gate electrode;
a dielectric layer disposed over the substrate; and
a gap defined beneath each spacer and between the dielectric layer and the gate electrode;
a conductive contact wider than the gate electrode, the conductive contact disposed on the dielectric layer and contacting the contact landing; and
a continuous silicide extending between distal ends of the spacers and over the gate electrode, wherein the contact contacts the silicide layer.

* * * * *

UNITED STATES PATENT AND TRADEMARK OFFICE
CERTIFICATE OF CORRECTION

PATENT NO.   : 6,104,077
DATED        : August 15, 2000
INVENTOR(S)  : Gardner et al.

It is certified that error appears in the above-identified patent and that said Letters Patent is hereby corrected as shown below:

Column 5,
Line 27, "thicknesses" should read -- thickness' --.

Column 6,
Line 26, "spacer apart" should read -- spacer, apart --.
Line 37, "spacers is" should read -- spacer is --.
Lines 39 and 42, "spacers has" should read -- spacer has --.

Column 8,
Line 53, "polysilicion" should read -- polysilicon --.

Signed and Sealed this

Eleventh Day of February, 2003

JAMES E. ROGAN
*Director of the United States Patent and Trademark Office*